United States Patent [19]

Morimoto

[11] Patent Number: 5,567,152

[45] Date of Patent: Oct. 22, 1996

[54] HEAT PROCESSING APPARATUS

[75] Inventor: Tamotsu Morimoto, Yamanashi-ken, Japan

[73] Assignee: Tokyo Electron Limited, Tokyo, Japan

[21] Appl. No.: 420,075

[22] Filed: Apr. 11, 1995

[30] Foreign Application Priority Data

Apr. 12, 1994 [JP] Japan .................................. 6-099348

[51] Int. Cl.⁶ ........................................................ F27D 3/12
[52] U.S. Cl. ............................. 432/241; 432/5; 432/152; 432/239; 432/245
[58] Field of Search ........................... 432/5, 6, 83, 152, 432/239, 241, 245

[56]  References Cited

U.S. PATENT DOCUMENTS 5,000,682  3/1991  Heidt et al. ............................ 432/239

FOREIGN PATENT DOCUMENTS 64-73613  3/1989  Japan .
61-68899  6/1994  Japan .

Primary Examiner—Henry A. Bennett
Assistant Examiner—Siddharth Ohri
Attorney, Agent, or Firm—Oblon, Spivak, McClelland, Maier & Neustadt, P.C.

[57]  ABSTRACT

A heat processing apparatus for subjecting heat processing to a wafer by heating includes a reaction tube for containing the wafers, a heating element provided around the reaction tube, for heating an inside of the reaction tube, a plurality of heat radiating members provided concentrically around the heating element with an airtight space between the heating element and an innermost one of the heat radiating members and airtight spaces between the heat radiating members, and a pressure-reducing device for reducing the pressure of these airtight spaces. In this heat processing apparatus, the pressures of the airtight spaces are reduced by the pressure-reducing means at least when the temperature of the inside of the reaction tube is increased.

14 Claims, 4 Drawing Sheets

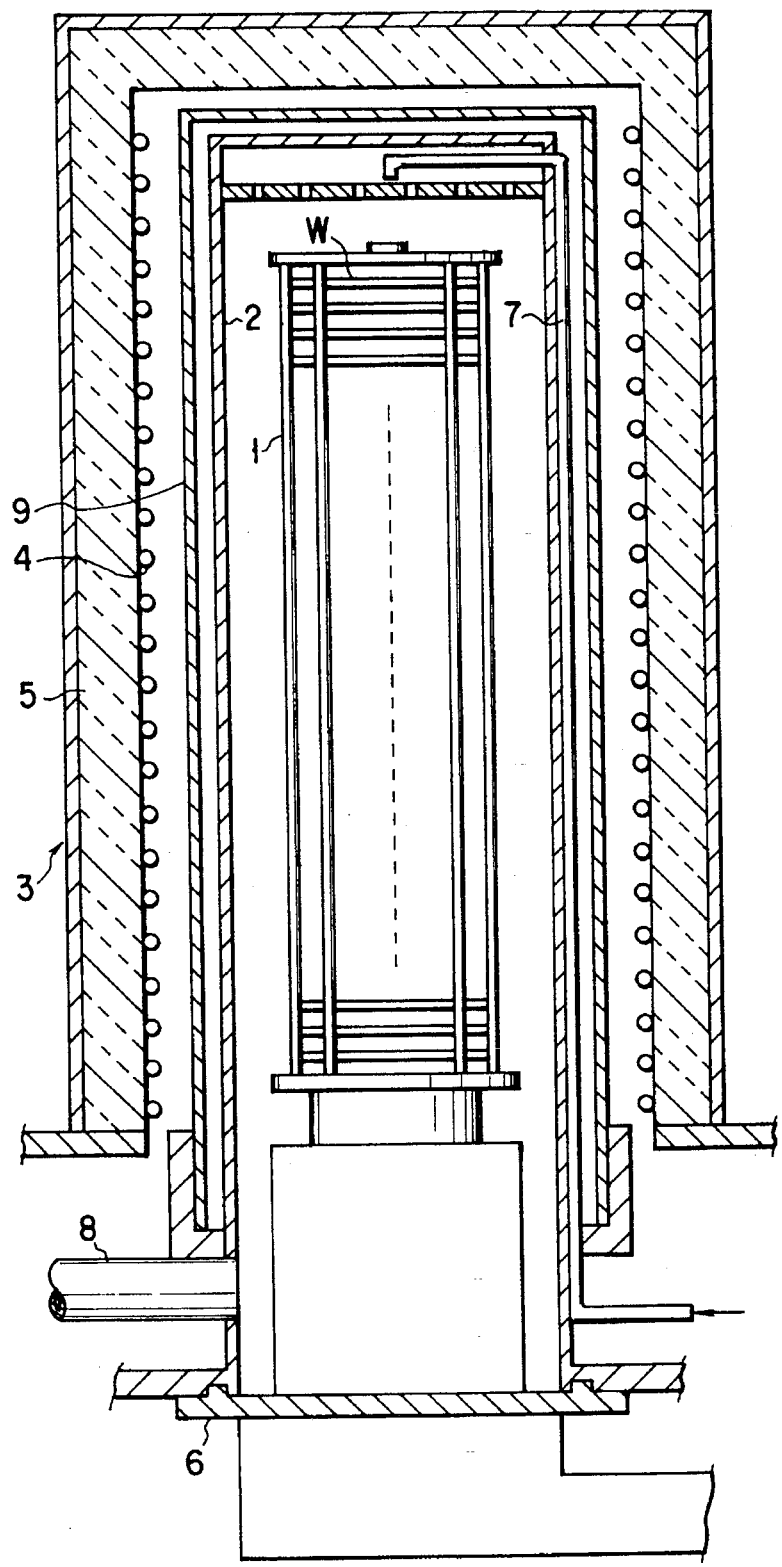
F I G. 1

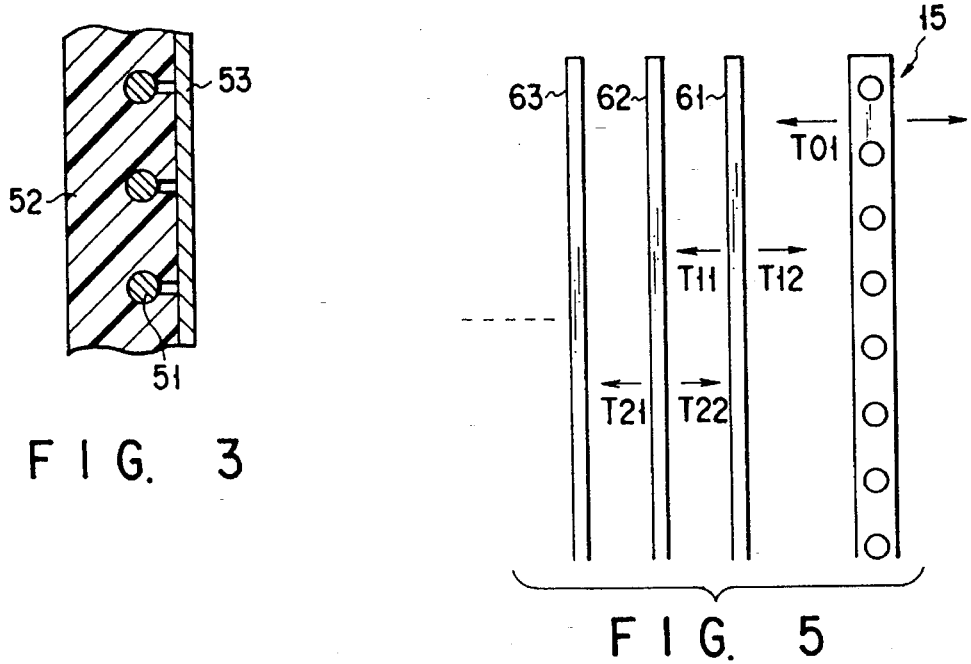
FIG. 3
FIG. 5
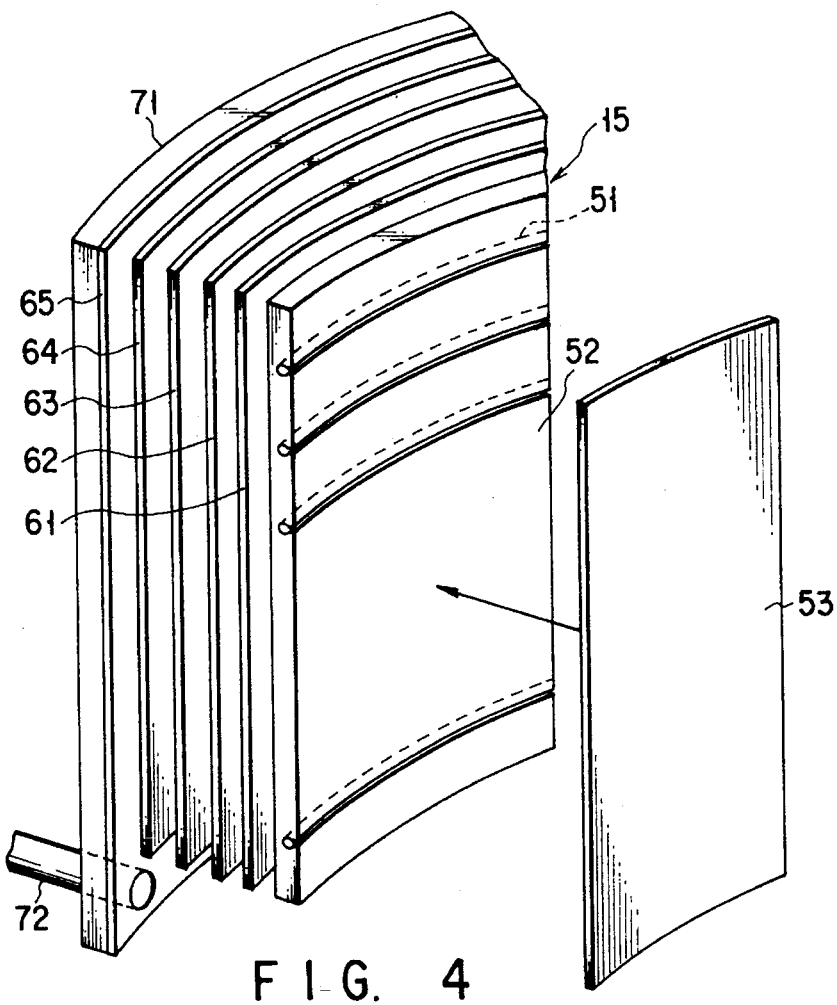
FIG. 4

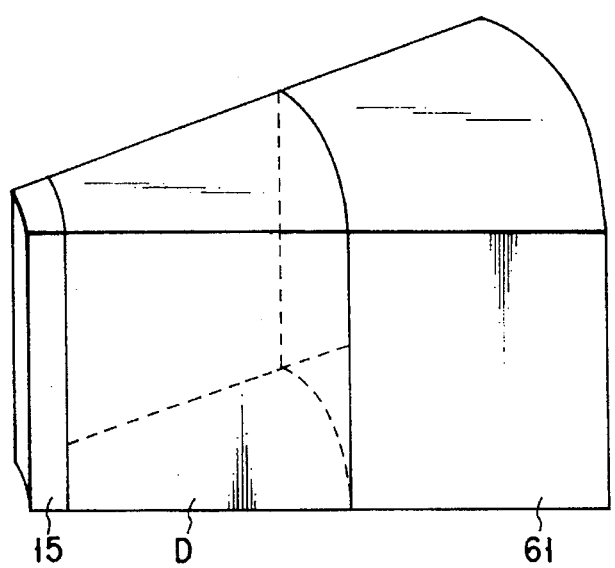
F I G. 6
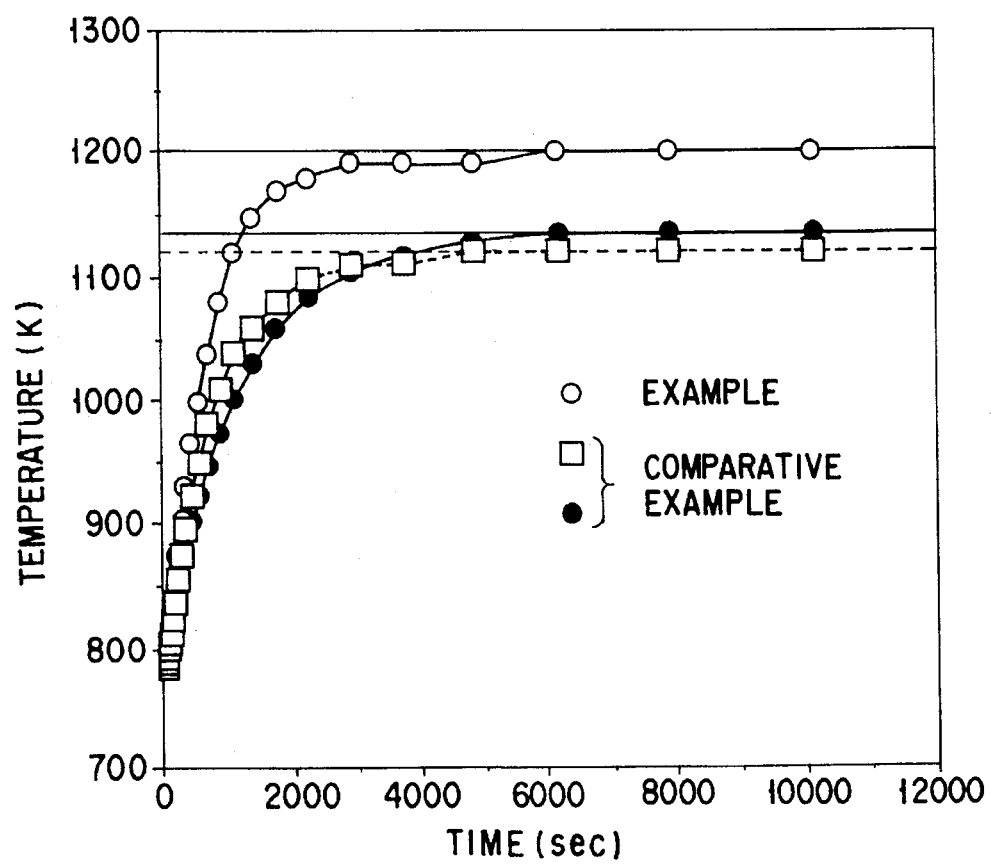
F I G. 7

HEAT PROCESSING APPARATUS

BACKGROUND OF THE INVENTION

1. Field of the Invention

The present invention relates to a heat processing apparatus for subjecting oxidation, diffusion, CVD and the like to an object to be processed, such as a semiconductor wafer.

2. Description of the Related Art

A process of manufacturing a semiconductor device includes an oxidation treatment of oxidizing a surface portion of silicon at high temperature to form an insulation (oxide) film, a diffusion treatment of thermally diffusing impurities into a silicon layer, on which an impurity layer is formed, by heating the silicon layer, and a CVD treatment of forming a film on the surface of a wafer by CVD.

As a heat processing apparatus for executing the above treatments, a vertical furnace has recently been used widely in place of a lateral one since it does not let much air therein.

The oxidation treatment performed by using a conventional vertical heat treatment apparatus, will now be described with reference to FIG. 1.

A number of semiconductor wafers W are arranged one on another and held in a wafer boat 1, and a reaction tube 2 is filled with an atmosphere of $N_2$ (nitrogen) gas and heated to, e.g., 700° C. by a heating device 3. The wafer boat 1 in which the wafers W are held, is loaded into the reaction tube 2 to thermally treat the wafers W. A heat equalizing tube 9 is provided outside the reaction tube 2.

The heating device 3 includes a heat insulating member 5 formed of, e.g., alumina and a resistive heating wire 4 is formed like a coil on the inner surface of the member 5. A water-cooled pipe (not shown) is provided inside the member 5. After the bottom end opening of the reaction tube 2 is closed airtightly by a cap 6, the heating device 3 increases the temperature of the tube 2 to a processing temperature of, e.g., 900° C., and the tube 2 is exhausted by using an exhaust tube 8 while $O_2$ (oxygen) gas is supplied into the tube 2, thereby forming an oxide film on the surface of each of the wafers W.

The temperature of the reactive tube 2 is dropped to, e.g., 700° C., and then the wafer boat 1 is carried out of the tube 2.

The impurity diffusion performed by the above heat treatment apparatus will be described. Impurity ions such as arsenic (As) ions are implanted into the surface of a silicon layer of a wafer, and this wafer is heated at a temperature ranging from, e.g., 900° to 1000° C. in the atmosphere of $N_2$ gas, thereby diffusing the impurity ions into the silicon layer. This diffusing treatment is similar to the oxidizing treatment, except for the gaseous atmosphere in the reactive tube.

It is known that the quality and thickness of an oxide film or a gate oxide film of, e.g., a capacitor insulating film formed by the above oxidation process, and the depth of a silicon layer to which impurity ions are diffused, are greatly influenced by the quantity of heat being received by a wafer until the temperature of the reaction tube reaches the processing temperature. More specifically, in the oxidation process, if a wafer is exposed to a temperature, which is lower than the processing temperature, for a long time, an oxide film of poor quality is formed under an oxide film of good quality, and the total quality deteriorates. In the diffusion treatment, the concentration profile of impurities diffused into a silicon layer depends upon the quantity of heat being received by the wafer until the temperature of the reaction tube reaches the processing temperature. If the quantity of heat is large, a diffusion region becomes too deep. Thus, it is necessary that the quantity of heat is made as small as possible to carry out the heat processing.

In the foregoing heat treatment apparatus, the heat insulating member 5 having a large heat capacity is formed on the outer periphery of the heating wire 4 in order to prevent heat dissipation. Since, however, a large quantity of heat is generated from the heating wire and absorbed by the heat insulating member by thermal conduction, the quantity of heat transmitted to the reaction tube 2 is reduced. Consequently, the reaction tube 2 cannot be heated with efficiency, and the speed of rising temperature in the tube 2 becomes slow. The temperature rises about 10° C. at most per minute.

If the inside temperature of the tube 2 is increased near to the processing temperature when a wafer is loaded, the growth of a natural oxide film formed on the surface of the wafer is promoted due to air let in the tube. The inside temperature of the tube cannot be increased too high when the wafer is loaded.

For the reason described above, in the conventional heat treatment apparatus, a long period of time is required until the inside temperature of the reaction tube reaches the treatment temperature and accordingly the total quantity of heat received by the wafer during the period of time is increased.

Recently the pattern of a device has been miniaturized and the film thickness has been decreased. It is thus necessary to greatly thin an oxide film to increase the capacity of, e.g., a capacitive insulation film of CMOS formed by oxidation. It is also necessary to decrease the depth to which impurities are diffused into a silicon layer in order to obtain a shallow pn junction. Therefore, the decrease in film quality and the variations in diffusion depth greatly influence the characteristic of a device.

In the conventional apparatus wherein a large quantity of heat is received by the wafer until the inside temperature of the tube reaches the processing temperature, the film quality of the wafer is lowered and the variations in diffusion depth occur. Consequently, the yield of devices is lowered, as is the throughput thereof.

SUMMARY OF THE INVENTION

The present invention has been developed in consideration of the above situation and its object is to provide a heat processing apparatus in which the rising speed of a processing tube is increased to reduce the quantity of heat required until the temperature of an object to be processed reaches a processing temperature and thus to increase in throughput.

According to a first aspect of the present invention, there is provided a heat processing apparatus for subjecting heat processing to an object to be processed by heating, comprising:

a reaction tube for containing the object;

a heating element provided around the reaction tube, for heating an inside of the reaction tube;

a heat radiating member provided around the heating element with an airtight space therebetween; and pressure-reducing means for reducing pressure of the airtight space, wherein the pressure of the airtight space is reduced by the pressure-reducing means at least when a temperature of the inside of the reaction tube is increased.

According to a second aspect of the present invention, there is provided a heat processing apparatus for subjecting heat processing to an object to be processed by heating, comprising:

a reaction tube for containing the object;

a heating element provided around the reaction tube, for heating an inside of the reaction tube;

a plurality of heat radiating members provided around the heating element, with an airtight space between the heating element and an innermost one of the plurality of heat radiating members and airtight spaces between the heat radiating members; and pressure-reducing means for reducing pressure of the airtight space and the airtight spaces, wherein the pressure of the airtight space and the airtight spaces are reduced by the pressure-reducing means at least when a temperature of the inside of the reaction tube is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a cross-sectional view showing a conventional heat treatment apparatus;

FIG. 3 is an enlarged cross-sectional view showing a heating element used in the apparatus of FIG. 2;

FIG. 4 is a perspective view showing a heating element and heat radiating plates of the apparatus of FIG. 2;

FIG. 5 is a schematic view for explaining heat radiation between the heating element and heat radiating plates of the apparatus of FIG. 2;

FIG. 6 is a view for explaining a simulation for explaining the advantage of the present invention; and FIG. 7 is a graph showing a relationship between time and temperature of a reaction tube with respect to the present invention and its compared examples.

DETAILED DESCRIPTION OF THE PREFERRED EMBODIMENT

Figure 2:
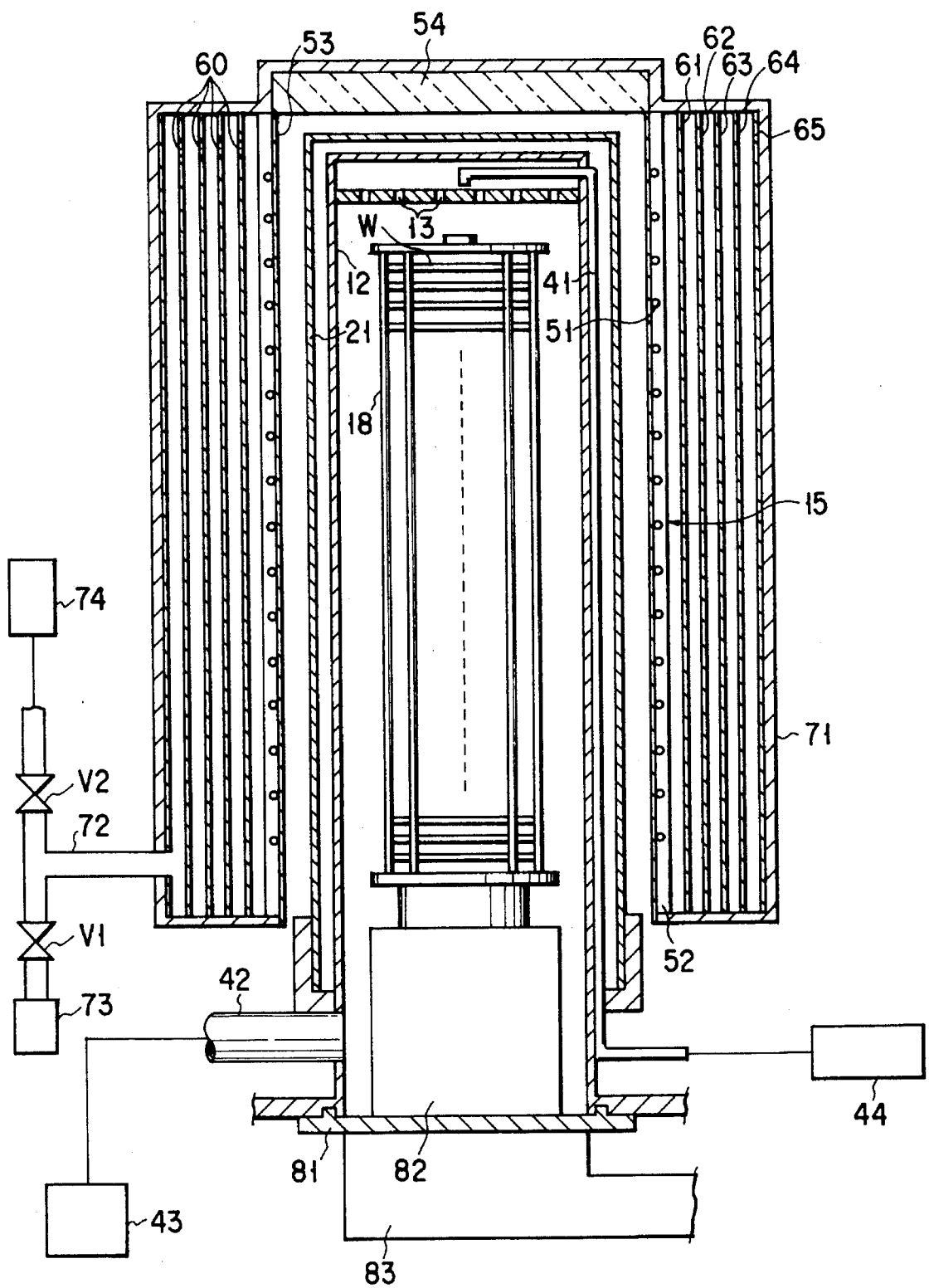
FIG. 2 is a cross-sectional view showing a heat treatment apparatus according to an embodiment of the present invention.

The principle of the present invention will be first described.

A heat treatment apparatus according to the present invention is so constructed that a heating element is formed around a reaction tube and a heat radiating member is provided around the heating element with an airtight space therebetween. If the pressure of the space between the heat radiating member and heating element is reduced by a pressure-reduction means when an object to be processed is heated in the reaction tube by increasing the temperature of the tube, heat is moved in the space mainly by radiation. The heat generated from the heating element radiates toward both the reaction tube and heat radiating member at once, and the heat radiating member is thus heated to generate heat. This heat is partially transferred outside the heat radiating member and at the same time toward the reaction tube. If the heat is so transferred between the heating element and heat radiating member, part of the heat emitted from the heating element to the outside (in the direction opposite to the reaction tube) is returned to the heating element itself, with the result that a large quantity of radiating heat moves toward the reaction tube, and the temperature of the tube can be elevated at high speed. Furthermore, a plurality of heat radiating plates are formed in a multilevel fashion with airtight spaces therebetween. If the pressure of these spaces is reduced, heat radiates from adjacent heat radiating members and is transferred therebetween. As a result, a large quantity of heat is returned to the heating element, and a larger quantity of radiating heat is moved toward the reaction tube. The temperature of the reaction tube can thus be elevated more rapidly.

A preferred embodiment of the present invention will now be described, with reference to the accompanying drawings.

FIG. 2 is a cross-sectional view showing a heat processing apparatus according to one embodiment of the present invention. A reaction tube 12 is constituted of quartz or fussed silica, and a number of openings 13 from which gas is supplied, are formed at the top of the tube 12. A soaking tube 21 is provided outside the reactive tube 12 with a space therebetween.

A gas supply tube 41 for supplying gas is formed between the tubes 12 and 21 and extends above the openings 13. The tube 41 is connected to a processing gas supply source 44 which supplies a processing gas to the reaction tube 12 through the gas supply tube 41.

A first exhaust tube 42 is connected to the apparatus under the reaction tube 12, and an exhaust device 43 is connected to the exhaust tube 42. The device 43 exhausts the reaction tube 12 through the exhaust tube 42. A predetermined pressure of the reaction tube 12 is thus maintained.

A heating element 15 for heating the reaction tube 12 is provided so as to surround the soaking tube 21. As is enlarged in FIG. 3, the heating element 15 includes a resistive heating wire 51 formed of, e.g., tungsten (W) and molybdenum disilicide ($MoSi_2$) or a supporter 52 formed of, e.g., ceramic and designed to support the wire 51. A cylindrical member 53 formed of, e.g., silicon carbide (SiC) or quartz is formed in contact with the inner surface of the resistive heating wire 51.

Five cylindrical heat radiating members 61–65, which are constituted of metal such as aluminum and tungsten, ceramic or the like, are provided concentrically, with airtight spaces therebetween, and an outer jacketing member 71 formed of, e.g., aluminum or stainless steel and having a cooling means such as a coolant path (not shown), is provided outside the outermost heat radiating member 65. A heat insulating member 54 is provided under the ceiling of the outer jacketing member 71.

A second exhaust tube 72 is connected to the outer jacketing member 71 so as to communicate with the airtight spaces between the heating element 15 and heat radiating plate 61 and between the heat radiating plates 61–65, and is also connected to a pressure reducing device 73 of, e.g., a vacuum pump through a valve vl. In other words, these spaces communicate with one another through communication holes 60 formed in the upper portions of the heat radiating plates 61–65, and the pressure thereof is reduced at once by the pressure reducing device 73. The exhaust tube 72 extends in the direction opposite to the pressure reducing device 73, too, and is connected to an inert gas supply source 74 through a valve V2. Instead of the inert gas supply source 74, the exhaust tube 72 can be opened to outside.

FIG. 4 is a perspective view of the heating element and heat radiating plates 61–65 for easy understanding of the arrangement thereof.

A wafer boat 18 in which wafers are held is loaded in the reaction tube 12. The boat 18 includes four supporting members of quartz or fused silica each having a groove in which the periphery of a wafer is inserted and held, and is placed above a cap 81 for making a lower end portion of the reactive tube 12 airtight, with a heat-retention cylinder 82 between them. In the wafer boat 18, for example, one-hundred wafers w are held and arranged horizontally one on another.

The cap 81 is provided on a boat elevator 83. The wafer boat 18 is moved up and down by the elevator 83 and thus loaded into the reaction tube 12 or unloaded therefrom.

An operation of the heat processing apparatus having the above constitution will be described hereinafter.

First an object to be processed, e.g., one-hundred wafers W are placed on the wafer boat 18. Then the reaction tube 12 is heated at a temperature of, e.g., 800° C. and supplied with $N_2$ gas from the gas supply tube 41 through the openings 13. In this state, the wafer boat 18 with the wafers w is loaded into the reaction tube 12.

when the temperature of the reaction tube 12 is raised up to, e.g., 950° C., processing gas such as oxygen gas is supplied from the gas supply tube 41 to the tube 12, and the wafers W are oxidized while a predetermined pressure of, e.g., 760 Torr is maintained in the tube 12.

After the oxidation, the temperature of the reaction tube 12 is dropped to, e.g., 800° C., and the wafer boat 18 is unloaded from the tube 12.

According to the present invention, when the temperature of the reaction tube 12 is elevated, the valve V2 is closed, and the valve V1 is opened to reduce the pressure of the spaces between the heating element 15 and heat radiating plate 61 and between the heat radiating plates 61–65 to, e.g., 1 mTorr by the pressure reducing device 73 and, at the same time, to heat the reaction tube 12 by the resistive heating wire 51.

If the pressure of spaces around the heating element 15 and between heat radiating plates 61–65 is reduced as described above, most transfer of heat in these spaces is performed by radiation. As shown in FIG. 5, the heat generated from the resistive heating wire 51 radiates in the direction of the reaction tube 12 and at the same time in the direction of the heat radiating plate 61 as radiation heat $T_{01}$. The plate 61 is heated by the radiation heat $T_{01}$, and part of the heat generated from the plate 61 is radiated as radiation heat $T_{11}$ to a heat radiating plate 62 outside the plate 61 and, at the same time, to the inside thereof (toward the heating element 5) as radiation heat $T_{12}$. Similarly, the heat accumulated in the heat radiating plate 62 is radiated both outside and inside as radiation heat $T_{21}$ and $T_{22}$, respectively, and part of the heat $T_{22}$, which is returned from the plate 62 to the plate 61, is radiated toward to the heating element 15. The heat is thus transferred between the heating element 15 and heat radiating plates 61–65, and part of the heat emitted outside from the heating element 15 is returned to the element 15 itself, so that the quantity of heat radiating from the heating element 15 to the reaction tube 12 is increased, and the temperature of the tube 12 can be raised at high speed.

In view of the above function of the heat radiating plates 61–65, it is preferable to thin these plates as much as possible and to set the thickness of each of them to about 1–10 mm. It is also preferable that a material having a 50% or more reflectance is used for the radiating plates and specific heat is lower. Furthermore, the pressure of spaces between the heating element 5 and heat radiating plate 61 and between the heat radiating plates 61–65 has only to be set such that the ratio ($\lambda/d$) of the mean free path ($\lambda$) of molecules and the distance (d) between the spaces is larger than 0.1 ($\lambda/d>0.1$) and in this case a desirable pressure is 1 mTorr or less. If the pressure is 1 mTorr, the ratio is about 50. The distance d is not restricted in particular but determined according to the size of a required apparatus.

When the temperature of the reaction tube 12 is dropped, the valve V1 is closed and the valve V2 is opened. Inert gas is thus supplied from the inert gas supply source 74 to the spaces described above to return the pressure of these spaces to the normal one. Therefore, in this case, the transfer of heat in the spaces is performed by conduction, and the heat is conducted to the low-temperature side, i.e., to the outer jacketing member 71, with the result that the temperature of the reaction tube 12 is quickly dropped. In this case, gas of high thermal conductivity, such as He gas is preferable as the inert gas supplied from the supply source 74. It is preferable to circulate the gas in order to quickly radiate the heat. Air can be supplied to the spaces between the heating element and heat radiating plates and in this case the part of the gas exhaust tube 72, which is located downstream from the valve V2, is opened.

If the resistive heating wire 51 is provided with its surface bared, it is oxidized and generates a metal oxide on the surface thereof. This metal oxide enters the reaction tube 12 and causes the wafers w to be polluted. Since, in this embodiment, the cylindrical member 53 of, e.g., SiC is interposed between the resistive heating wire 51 and reaction tube 12, the oxide generated on the surface of the resistive heating wire 51 can be prevented from scattering, and the wafers W can be prevented from being polluted with metal.

A calculation example which is obtained by performing calculation on the basis of simulation for confirming the advantage of the present invention, will now be described. In this example, variations in temperature of the reaction tube with time were calculated in the case where the heating element 15 is formed concentrically around the reaction tube and, as shown in FIG. 6, the cylindrical heat radiating plate 61 of aluminum is provided concentrically with a radiation space D far away from the heating element 15 (present invention). In this case, the amount of heat generated from the heating element 15 is $4.0 \times 10^6$ W/m$^3$ and the pressure of radiation space D is about 1 mTorr. Also, in this case, the outside of the heat radiating plate 61 is cooled to about 25° C. by the water-cooling when the reaction tube is heated.

For comparison, the same simulation was carried out in an apparatus (comparative example 1) wherein the reaction tube 2 is heated at the normal pressure without reducing the pressure of radiation space D and in the prior art apparatus (comparison example 2) wherein a heat insulating member whose thickness is 11.5 mm, thermal conductivity is 0.09 w/m·K, density is 400 kg/m$^3$, and specific heat is 1100 J/kg·K is formed in the space D.

The results of the above calculations are shown in FIG. 7. In FIG. 7, the abscissa represents time and the ordinate does temperature, and blank dots indicate the present invention (example), squares show comparative example 1, and solid dots represent comparative example 2. The aluminum of the heat radiating plate has a reflectance of 95% or more.

As is apparent from FIG. 7, the rising speed of the reaction tube in the apparatus of example 1 is slightly higher than that in the prior art apparatus of example 2, and a difference between them is extremely small. On the other hand, the rising speed of temperature in the present invention is considerably higher than those in examples 1 and 2, and it is about twice as high as that in the prior art apparatus of example 2.

The reason why the temperature rising speed of the reaction tube of the prior art apparatus is slow, is as follows.

If a heat insulating member is employed, since the heat generated from the resistive heating wire escapes toward the heat insulating member which is low in temperature and has a large heat capacity, the heat absorbed by the insulating member is increased and thus the heat generated from the heating element cannot be used effectively in raising the temperature of the reaction tube.

If the heat insulating member is replaced with the heat radiating plate with space D of the normal pressure, part of the heat generated from the heating element is transmitted to the reaction tube by radiation through the space D, and part of the heat is returned from the reaction tube to the heating element by radiation. Since, however, the pressure of space D is normal, the outward escape of heat greatly relies upon thermal conduction and therefore the temperature rising speed is not increased so greatly as compared with the case where the heat insulating is provided.

In contrast, if the pressure of space D is reduced, since the thermal conductivity thereof is lowered and, as described above, most transfer of heat is performed by radiation, part of the heat transmitted to the heat radiating plates is returned by radiation. Therefore, the amount of heat escaping outside the apparatus is decreased, and the generated heat can be effectively used to increase the temperature of the reaction tube, with the result that the rising speed becomes high, for example, about two times as high as that in the prior art apparatus.

As described above, since, in the present invention, the temperature of the reaction tube can be increased at high speed, and the wafers are not exposed to an atmosphere, whose temperature is lower than the processing temperature, for a long time, the quantity of heat received by the wafers can be reduced. Consequently, the quality and thickness of an oxide film formed on the surface of each wafer by oxidation can be prevented from being deteriorated because of a heat history, and a desired profile can be obtained when impurities are diffused. The yield is improved and accordingly the throughput is increased.

In the above embodiment, the present invention is applied to the oxidation. However, it can be applied to another heat processing and CVD processing. In the present invention, the heat radiating plates are not be always formed cylindrically but may have a transverse section of a quadratic prism, and two or more heat radiating plates can be provided one above another on the ceiling of the apparatus above the reaction tube, a space being formed between the heat radiating plates, thereby decreasing the heat radiating from the ceiling. Needless to say, the number of heat radiating plates can be one; however, it is preferable that three to five plates are effective in preventing heat from escaping. Furthermore, in the above embodiment, the inert gas or air is introduced into the space when the temperature of the reactive tube is dropped. However, another gas can be introduced unless it affects the heat processing.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat processing apparatus for subjecting heat processing to an object to be processed by heating, comprising:
    a reaction tube for containing the object;
    a heating element provided around said reaction tube, for heating an inside of said reaction tube;
    a heat radiating member provided around said heating element with an airtight space therebetween; and
    pressure-reducing means for reducing pressure of said airtight space for achieving heat transfer mainly by radiation at least when a temperature inside said reaction tube is increased.

2. The apparatus according to claim 1, further comprising gas introducing means for introducing gas into the airtight space.

3. The apparatus according to claim 1, wherein said reaction tube, said heating element, and said heat radiating member are shaped cylindrically and concentrically with one another.

4. The apparatus according to claim 1, wherein said heat radiating member has a thickness ranging from 1 to 10 mm.

5. The apparatus according to claim 1, wherein said heat radiating member has a reflectance of 50% or more.

6. The apparatus according to claim 1, wherein said heat radiating member is formed of one of aluminum and tungsten.

7. The apparatus according to claim 1, wherein said pressure-reducing means reduces the pressure of the airtight space to 1 mTorr or lower.

8. A heat processing apparatus for subjecting heat processing to an object to be processed by heating, comprising:
    a reaction tube for containing the object;
    a heating element provided around said reaction tube, for heating an inside of said reaction tube;
    a plurality of heat radiating members provided around said heating element, with an airtight space between said heating element and an innermost one of said plurality of heat radiating members and at least one airtight space between said heat radiating members; and
    pressure-reducing means for reducing pressure of said airtight spaces for achieving heat transfer mainly by radiation at least when a temperature inside said reaction tube is increased.

9. The apparatus according to claim 8, further comprising gas introducing means for introducing gas into the airtight space.

10. The apparatus according to claim 8, wherein said reaction tube, said heating element, and said plurality of heat radiating members are shaped cylindrically and concentrically with one another.

11. The apparatus according to claim 8, wherein said plurality of heat radiating members each have a thickness ranging from 1 to 10 mm.

12. The apparatus according to claim 8, wherein said plurality of heat radiating members each have a reflectance of 50% or more.

13. The apparatus according to claim 8, wherein said plurality of heat radiating members are formed of one of aluminum and tungsten.

14. The apparatus according to claim 8, wherein said pressure-reducing means reduces the pressure of the airtight space to 1 mTorr or lower.

* * * * *